US009455011B2

United States Patent
Raychowdhury et al.

(10) Patent No.: US 9,455,011 B2
(45) Date of Patent: Sep. 27, 2016

(54) METHODS AND SYSTEMS TO READ A MAGNETIC TUNNEL JUNCTION (MTJ) BASED MEMORY CELL BASED ON A PULSED READ CURRENT

(75) Inventors: Arijit Raychowdhury, Duluth, GA (US); David Kencke, Beaverton, OR (US); Brian Doyle, Portland, OR (US); Charles Kuo, Hillsboro, OR (US); James Tschanz, Portland, OR (US); Fatih Hamzaoglu, Portland, OR (US); Yih Wang, Portland, OR (US); Roksana Golizadeh Mojarad, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/350,997

(22) PCT Filed: Mar. 25, 2012

(86) PCT No.: PCT/US2012/030490
§ 371 (c)(1),
(2), (4) Date: Apr. 10, 2014

(87) PCT Pub. No.: WO2013/147728
PCT Pub. Date: Oct. 3, 2013

(65) Prior Publication Data
US 2015/0206564 A1    Jul. 23, 2015

(51) Int. Cl.
*G11C 11/00* (2006.01)
*G11C 11/16* (2006.01)
(Continued)

(52) U.S. Cl.
CPC .............. *G11C 11/165* (2013.01); *G11C 5/12* (2013.01); *G11C 11/1673* (2013.01); *G11C 11/1693* (2013.01); *G11C 2013/0052* (2013.01); *G11C 2013/0071* (2013.01)

(58) Field of Classification Search
CPC ...... G11C 11/165; G11C 5/12; G11C 11/161
See application file for complete search history.

(56) References Cited

U.S. PATENT DOCUMENTS 8,885,395 B2 * 11/2014 Zhou .................... G11C 11/161
365/148
2006/0245242 A1    11/2006 Rizzo et al.
(Continued)

FOREIGN PATENT DOCUMENTS

CN    101067967 A    11/2007
JP    2002-140888 A    5/2002
(Continued)

OTHER PUBLICATIONS

Notice of Allowance received for Chinese Patent Application No. 201320228713.4, mailed on Feb. 7, 2014, 2 pages of Notice of Allowance only.
(Continued)

*Primary Examiner* — Richard Elms
*Assistant Examiner* — Mohammed A Bashar
(74) *Attorney, Agent, or Firm* — Garrett IP, LLC (57) ABSTRACT

Methods and systems to read a logic value stored in a magnetic tunnel junction (MTJ)-based memory cell based on a pulsed read current, with time between pulses to permit the MTJ to relax towards the magnetization orientation between the pulses, which may reduce build-up of momentum within the MTJ, and which may reduce and/or eliminate inadvertent re-alignment of a magnetization orientation. A sequence of symmetric and/or non-symmetric pulses may be applied to a wordline (WL) to cause a pre-charged bit line (BL) capacitance to discharge a pulsed read current through the MTJ, resulting in a corresponding sequence of voltage changes on the BL. The BL voltage changes may be integrated over the sequence of read current pulses, and a stored logic value may be determined based on the integrated voltage changes. The pre-charged BL capacitance may also serve as the voltage integrator.

20 Claims, 8 Drawing Sheets

(51) Int. Cl.
*G11C 5/12* (2006.01)
*G11C 13/00* (2006.01)

(56) References Cited

U.S. PATENT DOCUMENTS

| | | | |
|---|---|---|---|
| 2007/0177420 A1* | 8/2007 | Guo | B82Y 25/00 |
| | | | 365/158 |
| 2007/0258281 A1 | 11/2007 | Ito et al. | |
| 2008/0043519 A1 | 2/2008 | Kitagawa et al. | |
| 2010/0085796 A1 | 4/2010 | Zhu et al. | |
| 2010/0110784 A1* | 5/2010 | Zheng | G11C 11/16 |
| | | | 365/171 |
| 2010/0238712 A1 | 9/2010 | Xi | |
| 2011/0038216 A1 | 2/2011 | Chen | |
| 2011/0273926 A1* | 11/2011 | Wu | G11C 11/16 |
| | | | 365/158 |

FOREIGN PATENT DOCUMENTS

| | | |
|---|---|---|
| JP | 2008-047257 A | 2/2008 |
| KR | 10-2002-0018149 A | 3/2002 |
| WO | 2013147728 A1 | 10/2013 |

OTHER PUBLICATIONS

International Preliminary Report on Patentability and Written Opinion received for PCT Patent Application No. PCT/US2012/030490, mailed on Oct. 9, 2014, 7 pages.

Office Action Received for Chinese Patent Application No. 201320228713.4, mailed on Aug. 19, 2013.

Office Action Received for Chinese Patent Application No. 201320228713.4, mailed on Nov. 11, 2013.

International Search Report and Written Opinion of the International Searching Authority, mailed on Nov. 23, 2012.

Office Action received for Korean Patent Application No. 10-2014-7026325, mailed on Dec. 16, 2015, 2 pages of English Translation and 4 pages of Korean Office Action.

Extended European Search Report received for European Patent Application No. 12872781.5, mailed on Nov. 10, 2015, 8 pages.

Office Action received for Japanese Patent Application No. 2014-559878, mailed on Aug. 11, 2015, 4 pages of English Translation and 4 pages of Japanese Office Action.

* cited by examiner

METHODS AND SYSTEMS TO READ A MAGNETIC TUNNEL JUNCTION (MTJ) BASED MEMORY CELL BASED ON A PULSED READ CURRENT

BACKGROUND

Spin-transfer torque is an effect in which the orientation of a magnetic layer may be modified using a spin-polarized current.

Charge carriers, such as electrons, have a relatively small quantity of intrinsic angular momentum, referred to as spin. An un-polarized electrical current has approximately 50% spin-up electrons and 50% spin-down electrons. A spin-polarized current has more spin-up or spin-down electrons. By passing a current through a magnetic layer, one can produce a spin-polarized current. When a spin-polarized current is directed into a magnetic layer, angular momentum may be transferred to the magnetic layer, which may induce or excite oscillations in the magnetic layer. Above a threshold, the oscillations may trigger a switch in magnetization orientation of the layer. Such effects may occur in nanometer scale devices.

A magnetic tunnel junction (MTJ) may include an oxide layer sandwiched between first and second ferromagnetic (FM) layers, also referred to as a reference layer and a free layer, respectively. The reference layer may have a fixed magnetic orientation or state, and the free layer may have a variable magnetic orientation or state. The MTJ exhibits relatively low resistance when the magnetic alignment the reference and free layers is parallel, and relatively high resistance when the magnetizations are counter-parallel.

A MTJ may be implemented as a non-volatile memory cell in which digital logic values of 0 and 1 are associated with corresponding magnetization alignment states of the MTJ. Multiple MTJ memory cells may be implemented as a spin-transfer torque random-access memory (STT-RAM).

A logic value may be written to a MTJ memory cell by directing a write current through the MTJ sufficient to overwrite, or flip an existing magnetization alignment of the MTJ.

A logic valued stored in a MTJ memory cell may be read based on resistance of the memory cell, which may be determined based on a read current that passes through the memory cell.

The read current, or read current density, should be less than a critical current or critical current density that would re-orientate or overwrite the existing magnetization alignment of the MTJ.

Nevertheless, even a small read current may assert a torque on the magnetization orientation of an MTJ. In addition, a MTJ may be subject to random thermally induced torques, which may vary with process, voltage, and/or temperature variations. The sum of all these torques may result in switching or flipping of the magnetization orientation of the MTJ. This may be exasperated where higher read currents are employed to decrease read times.

A write back scheme may be employed after a read operation to ensure that the MTJ has the intended magnetization state. However, if the read operation causes the magnetization orientation of the MTJ to switch or flip early in a read operation, the read operation may read or sense the incorrect flipped state of the MTJ.

BRIEF DESCRIPTION OF THE DRAWINGS/FIGURES

In the drawings, the leftmost digit(s) of a reference number identifies the drawing in which the reference number first appears.

DETAILED DESCRIPTION

Figure 1:
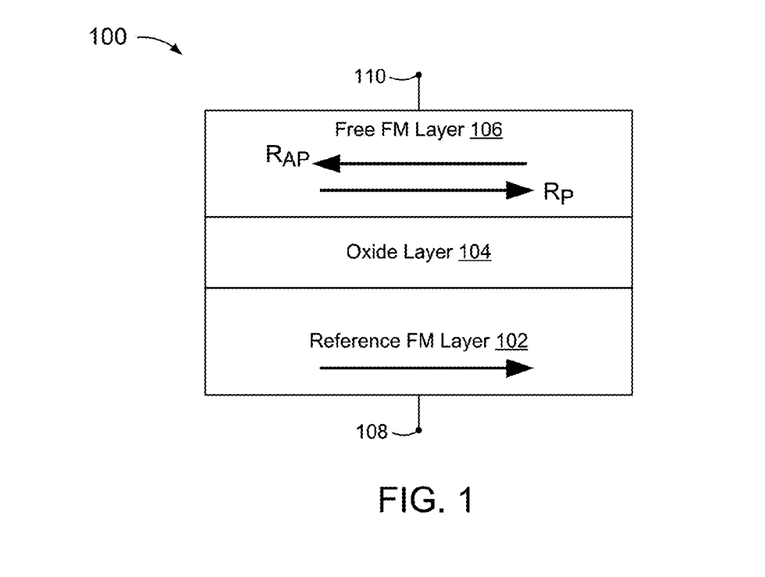
FIG. 1 is a block diagram of a magnetic tunnel junction (MTJ).

FIG. 1 is a block diagram of a magnetic tunnel junction (MTJ) 100, including an oxide barrier layer 104 such as MgO, positioned between first and second ferromagnetic (FM) layers 102 and 106.

First FM layer 102 may have a fixed magnetic orientation, and may be referred to as a reference layer.

Second FM layer 106 may have a variable magnetic orientation, and may be referred to as a free layer.

The magnetization orientation or direction of free layer 106 may be changed by passing a driving polarized current through free layer 106. The current may be provided by applying a voltage applied across nodes 108 and 110, and the current may be polarized by reference layer 106.

For example, a positive voltage applied to node 108 may result in the magnetization orientation of free layer 106 being opposite or counter-parallel to that of reference layer 102, which results in a relatively high resistance between nodes 108 and 110 and a relatively low current through MTJ 100.

Conversely, a positive voltage applied to node 110 may result in the magnetization orientation of free layer 106 being parallel with that of reference layer 102, which results in a relatively low resistance between nodes 108 and 110 and a relatively high current through MTJ 100.

Figure 2:
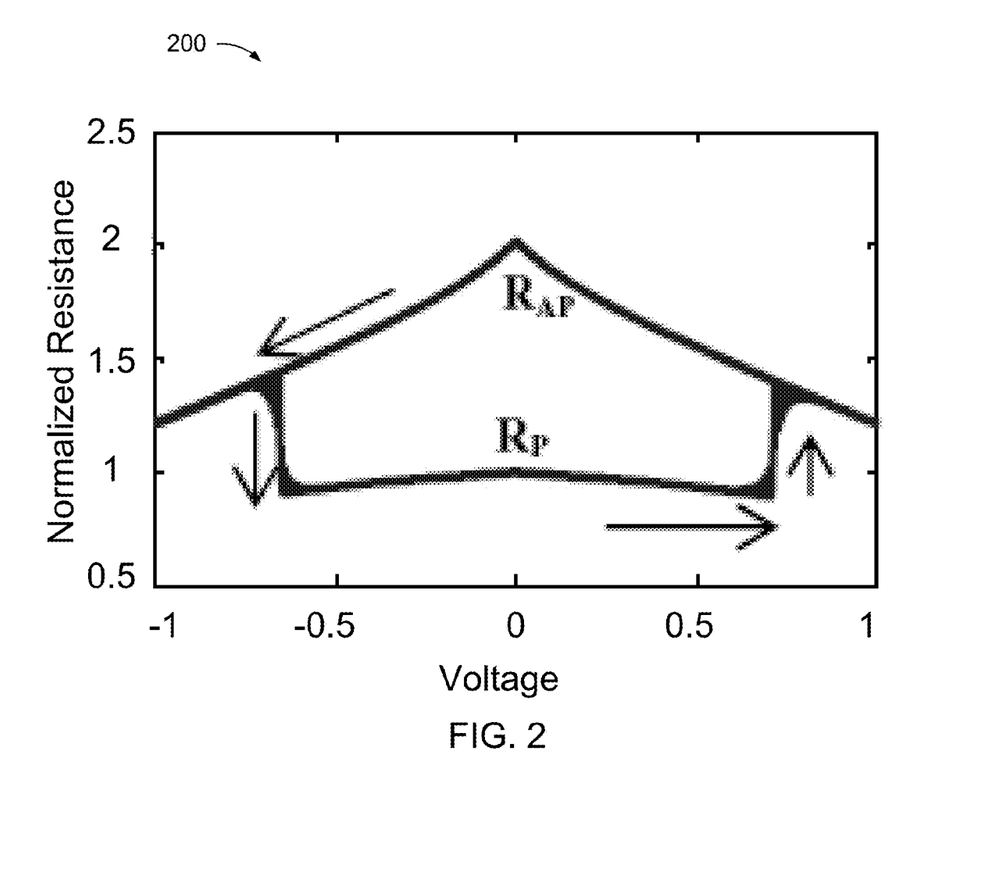
FIG. 2 is a graph of resistance versus voltage for a MTJ, with respect to first and second magnetic orientation states.

FIG. 2 is a graph 200 of resistance versus voltage for a MTJ, such as MTJ 100, with respect to first and second magnetic orientation states.

In graph 200, a MTJ may exhibit a relatively low resistance $R_P$ when the magnetization orientations of the free layer and reference layer are parallel with one another, and may exhibit a relatively high resistance $R_{AP}$ when the magnetization orientations of the free layer and reference layer are counter-parallel.

The parallel and counter-parallel alignments states of a MTJ may be associated with logic states. For example, parallel alignment, or low resistance, may be associated with a logic value 0, and counter-parallel alignment, or high resistance, may be associated with a logic value 1. Methods and systems disclosed herein are not, however, limited to these examples.

Figure 3:
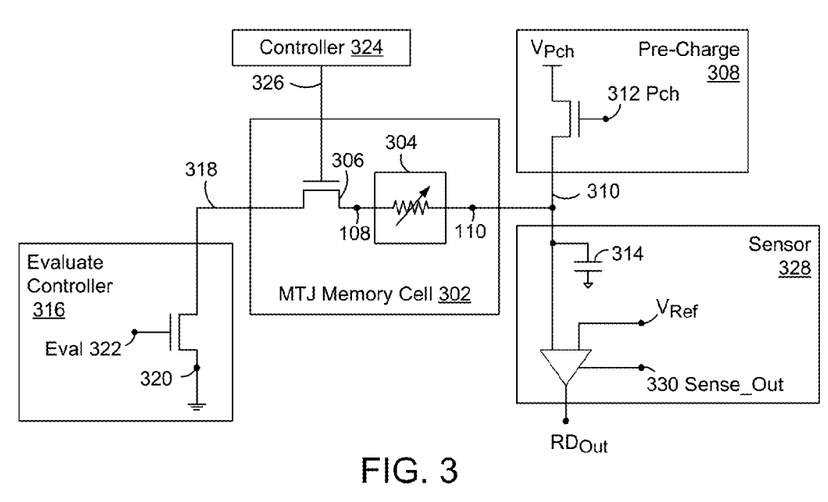
FIG. 3 is a circuit diagram of a memory system including a MTJ-based non-volatile memory cell.

FIG. 3 is a circuit diagram of a memory system 300 including a MTJ-based non-volatile memory cell 302.

Memory cell 302 includes a MTJ 304, illustrated here as a variable resistor, and an access transistor 306. Memory cell 302 may be referred to as a one-transistor-one-resistor (1T1R) MTJ memory cell, or a one-transistor-one-MTJ (1T1J) memory cell.

Memory system 300 further includes a pre-charge circuit 308 to pre-charge a first node 310 of MTJ 304 prior to or at the beginning of a read operation. Pre-charge circuit 308 may be implemented to pre-charge node 310 to a pre-charge voltage $V_{Pch}$ under control of a pre-charge control 312. The pre-charge may be held or stored in a capacitance 314, which may represent an inherent capacitance and/or a fabricated capacitor. Capacitance 314 may exhibit a pre-charge voltage, which may depend upon the amount of pre-charge applied and a size of the capacitance.

Memory system 300 may include an evaluate controller 316 to couple a second node 318 of MTJ 100 to a node 320 under control of an evaluation control 322. In the example of FIG. 3, node 320 corresponds to ground. Evaluation control 322 may be activated prior to, simultaneously with, or after pre-charge control 308.

Memory system 300 further includes a controller 324 to control access transistor 306 with a control 326. Memory system 300 may be implemented to close access transistor 306 during a read operation after node 310 is pre-charged and while node 318 is coupled to node 320.

When access transistor 306 is closed, pre-charge may flow from node 310 to node 320 through MTJ 304. The amount of charge that flows through MTJ 304 may depend upon a resistance of MTJ 304, which may depend upon a magnetization orientation of a free layer of MTJ 304 as described above. The amount of charge that flows through MTJ 304 may further depend on an amount of time for which access transistor 306 is closed and/or the pre-charge voltage at node 310.

Memory system 300 may include a sensor 328 to determine a logic value stored in MTJ 304 based on charge flow through MTJ 304. For example, when access transistor 306 is closed, any charge that flows from capacitor BL 310 to node 320 through MTJ 304 will reduce the charge and corresponding voltage at node 310. In this example, sensor 328 may include a voltage sensor to sense the voltage of BL 310. The voltage sensor may be implemented to compare the voltage at node 310 with a reference voltage.

Sensor 328 may be implemented to output a read value $RD_{OUT}$ as a logic value of 0 or 1 depending on the amount of charge that flows through MTJ 100, which may be determined based on the voltage at node 310 as described above. Sensor 328 may be implemented to determine and/or output $RD_{OUT}$ in response to a sense_out control 330.

Figure 4:
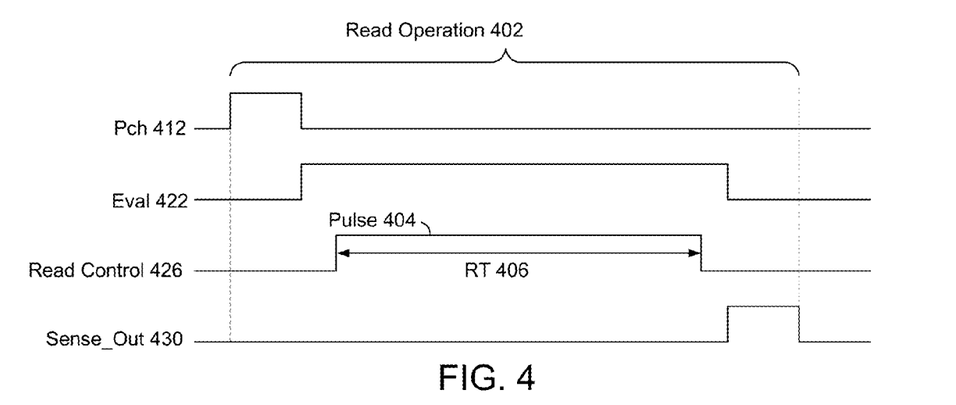
FIG. 4 is a timing diagram of a read operation of an MTJ, based on a read control having a pulse that is active continuously throughout a read time.
Figure 5:
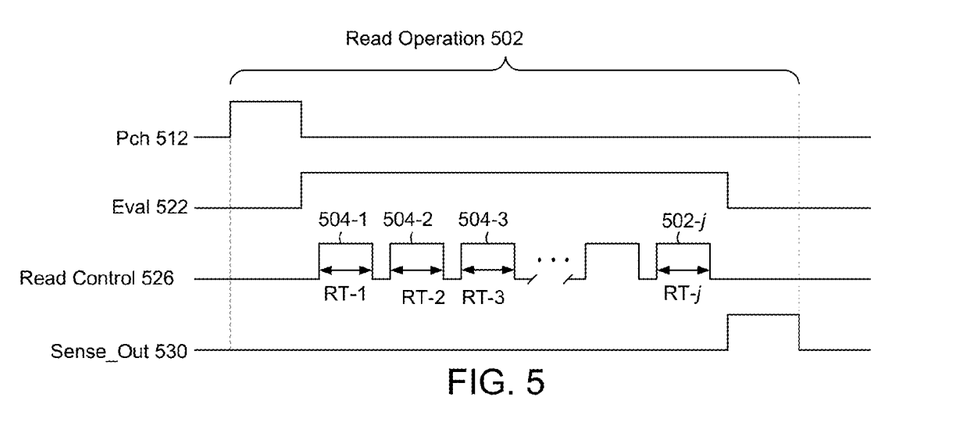
FIG. 5 is a timing diagram of a read operation of an MTJ, including a read control having multiple pulses.
Figure 6:
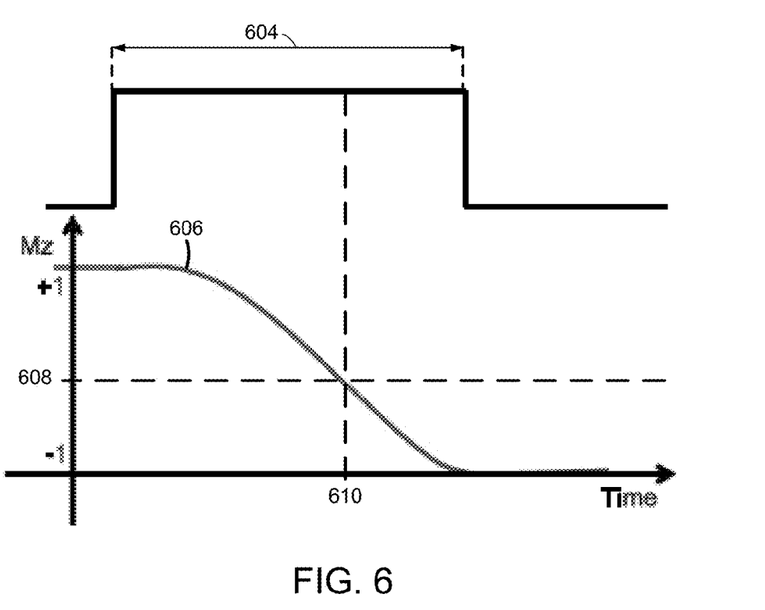
FIG. 6 is a magnetization orientation graph for a MTJ having a continuous read current.
Figure 7:
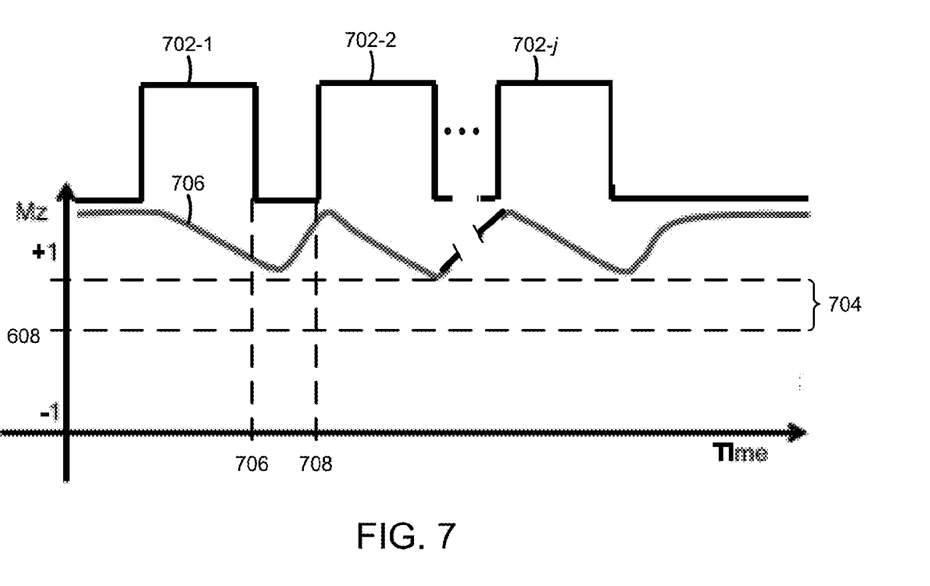
FIG. 7 is a magnetization orientation graph for a MTJ having a read current applied intermittently during each of multiple pulses.
Figure 8:
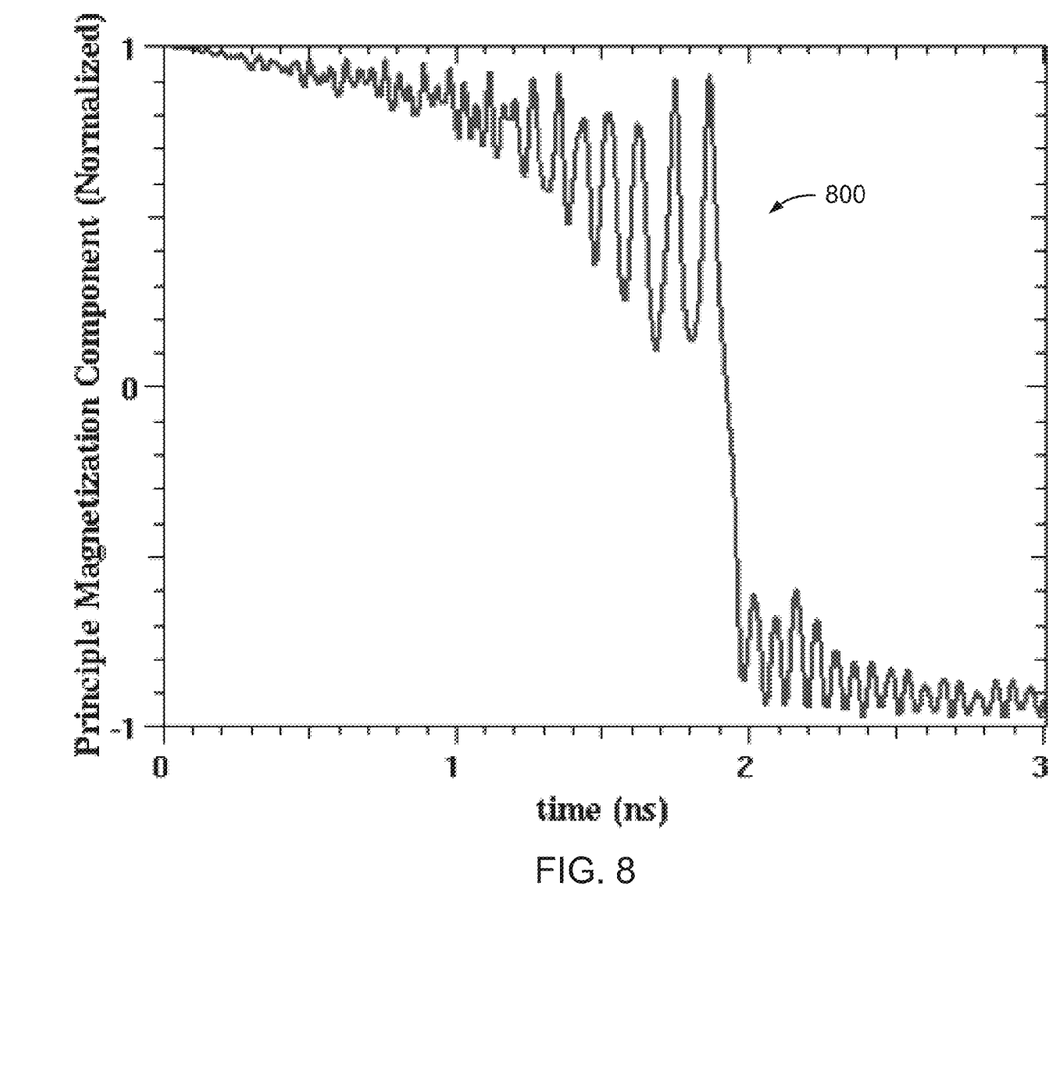
FIG. 8 is a graph of simulated magnetization oscillations for a MTJ for which a continuous read pulse is applied.
Figure 9:
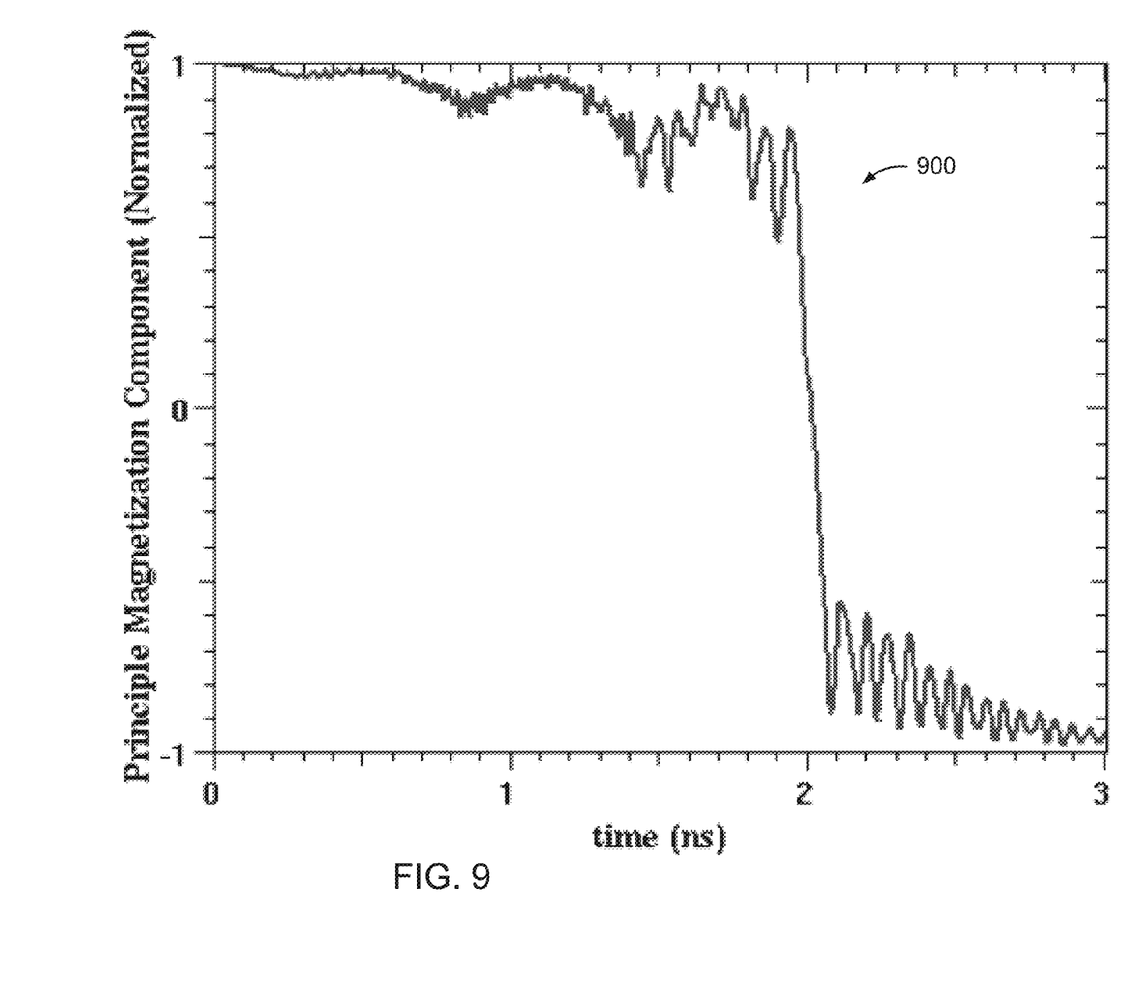
FIG. 9 is a graph of simulated magnetization oscillations for the MTJ of FIG. 8, for which multiple read pulses are applied.

During a read operation, controller 324 may be implemented to close access transistor 306 for a pre-determined amount of time, referred to as a read time RT, such as illustrated in FIGS. 4, 6, and 8. Alternatively, controller 324 may be implemented to intermittently open and close access transistor 306, such as illustrated in FIGS. 5, 7, and 9.

FIG. 4 is a timing diagram of a read operation 402 of an MTJ, including a read control 426 having a pulse 404 that is active continuously throughout a read time RT 406. FIG. 4 further includes a pre-charge control 412, an evaluation control 422, and a sense_out control 430, such as described above with reference to FIG. 3.

FIG. 5 is a timing diagram of a read operation 502 of an MTJ, including a read control 526 having multiple pulses 504 that are active during corresponding read times RT-1 through RT-j, for a total read time of:

$$RT_{Tot} = \sum_{i=1}^{j} RT_i$$

Each of read times RT-1 through RT-j may be less than read time RT in FIG. 4.

Pulses 504 may be generated such the total charge flow through the MTJ over $RT_{Tot}$ is equivalent to the charge flow through the MTJ during pulse 404 in FIG. 4. For example, pulses 504 may be generated such that $RT_{Tot}$ of FIG. 5 is equivalent to read time RT of FIG. 4. Alternatively, a higher read current may be applied during pulses 504 than during pulse 404, and $RT_{Tot}$ of FIG. 5 may be less than RT of FIG. 4.

As described further above, even a relatively small read current through a MTJ may assert a torque on an existing magnetization orientation. A pulsed read control, such as read control 526 in FIG. 5, may permit the free layer of an MTJ to relax or return to an existing magnetization orientation between pulses 504. This may reduce and/or eliminate build-up of momentum on the free layer of the MTJ during a read operation, which may reduce and/or eliminate inadvertent or unintentional switching of the magnetization orientation, such as described below with reference to FIGS. 6 and 7.

FIG. 6 is a magnetization orientation graph for a MTJ having a read current continuously over time 604.

In the example of FIG. 6, a magnetization orientation 606 begins at a first state, illustrated here as +1. During time 604, the read current applies a torque to the free layer of the MTJ that causes the magnetization orientation to increasingly pull away from state +1 and towards state −1. As long as the magnetization orientation is not pulled beyond a critical level, illustrated at 608 in FIG. 6, the MTJ will return to magnetization orientation +1 if the read current is removed. If, however, the magnetization orientation is pulled beyond critical level 608, the magnetization orientation will flip to magnetization orientation −1 when the read current is removed. In FIG. 6, 610 represents a time at which a critical current or current density is reached.

FIG. 7 is a magnetization orientation graph for a MTJ having a read current applied intermittently during each of multiple pulses 702.

In the example of FIG. 7, a magnetization orientation 706 begins at state +1. During each pulse 702, the read current applies a torque to the free layer of the MTJ that causes the magnetization orientation to pull slightly away from state +1 towards state −1. Between pulses 702, the magnetization orientation relaxes back to state +1, as illustrated between times 706 and 708. The relaxation between pulses 702 provides a margin 704 relative to critical level 608. Margin 704 may reduce and/or eliminate build-up of momentum of the free layer of the MTJ during, which may reduce a disturb probability.

FIG. 8 is a graph of simulated magnetization oscillations 800 for a MTJ for which a continuous read pulse is applied. As illustrated in FIG. 8, oscillations 800 build in the MTJ until the magnetization orientation switches at just under 2 ns.

FIG. 9 is a graph of simulated magnetization oscillations 900 for the MTJ of FIG. 8, for which four read pulses are applied within 2 ns to provide an equivalent amount of charge, or current density as in FIG. 8. As illustrated in FIG. 9, while the magnetization oscillates during the read pulses, the oscillations relax between the pulses to increase the critical current density read margin.

In FIG. 3, where read control 326 includes a sequence of pulses, sensor 328 may be implemented to integrate an indication of current or charge flow through MTJ 304. In the example of FIG. 3, capacitance 314 may serve as both a pre-charge storage device and a voltage integrator to integrate voltage changes in the pre-charge.

Pulse shaping is now described.

Pulses 504 in FIG. 5, and pulses 702 in FIG. 7, are illustrated as corresponding symmetric pulse trains in which pulses have similar amplitudes and durations. Methods and systems disclosed herein are not, however, limited to these examples.

Controller 324 in FIG. 3 may, for example, include a pulse shaper to provide read control 326 as a sequence of pulses having various pulse shapes, which may include, without limitation, variations in duration, amplitude, rise time, and/or fall time. Pulse shaping may be implemented to provide and/or control one or more of a variety of features and/or effects, such as described below.

In FIG. 6, it can be seen that a certain amount of initial torque or read current may be needed to pull a magnetization orientation away an MTJ a current state, or easy axis. Once the magnetization orientation is pulled from the easy axis, however, less torque or read current may be needed to pull magnetization orientation further from the easy axis.

In FIG. 3, controller 324 may be implemented to provide read control 326 as a sequence of pulses that are shaped to provide a higher initial read current followed by progressively less read current. Controller 324 may be implemented to shape the pulses maintain a relatively consistent margin throughout a read operation. Pulse shaping may include variations in amplitude and/or pulse duration. An example is provided below with reference to FIG. 10.

Figure 10:
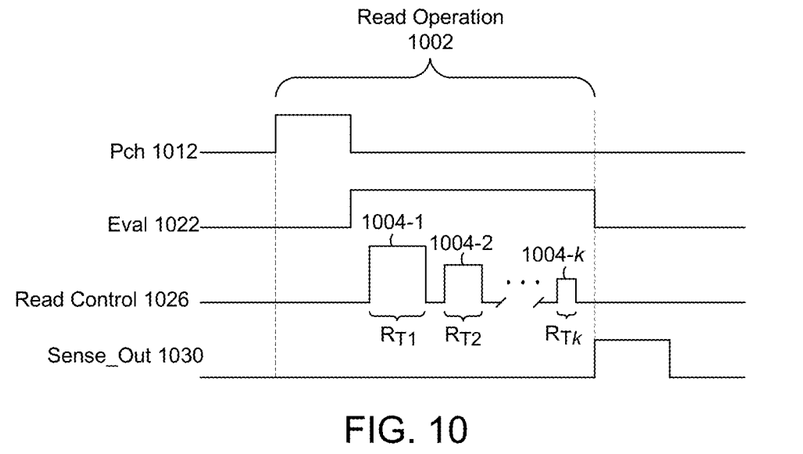
FIG. 10 is a timing diagram of a MTJ read operation, including a read control having a sequence of pulses.

FIG. 10 is a timing diagram of a MTJ read operation 1002, including a read control 1026 having a sequence of pulses 1004. FIG. 10 further includes a pre-charge control 1012, an evaluation control 1022, and a sense_out control 1030, such as described above with reference to FIG. 3. In the example of FIG. 10, amplitudes and durations of pulses 1004 decrease with subsequent pulses.

Multiple MTJ-based memory cells may be implemented as an array of memory cells, such as described below with reference to FIG. 11.

Figure 11:
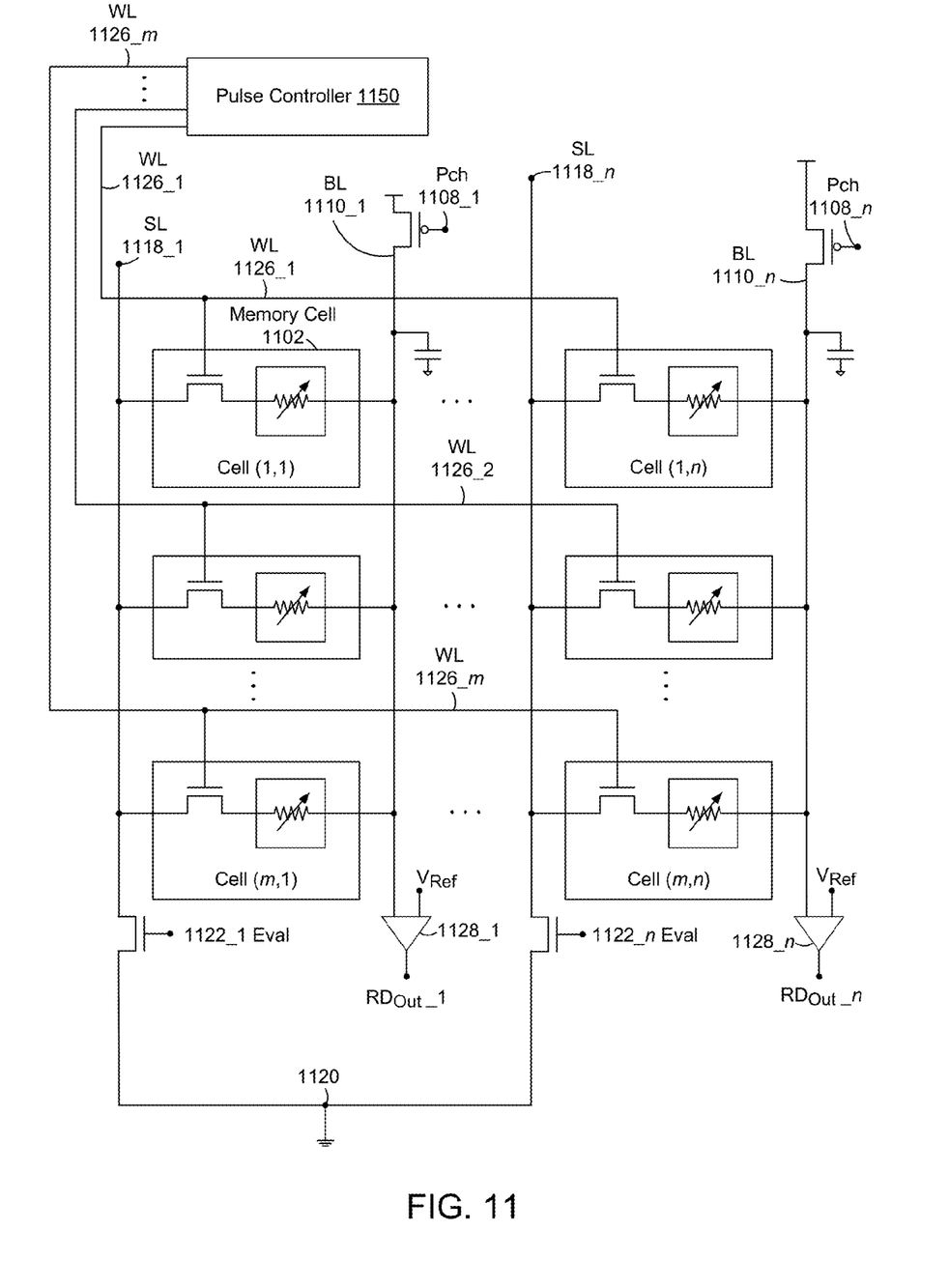
FIG. 11 is a block diagram of a memory system, including an array of non-volatile spin-transfer torque (SST) memory cells.

FIG. 11 is a block diagram of a memory system 1100, including an array of non-volatile spin-transfer torque (SST) memory cells 1102, also denoted as cells (1, 1) through (m, n). Memory cells 1102 may be implemented as described in one or more examples herein. Memory system 1100 may be implemented as a spin-transfer torque random-access memory (STT-RAM) system.

Memory system 1100 may include a pulse controller 1150 to apply a sequence of electrical pulses to selectable word-lines (WLs) 1126 during read operations, such as described in one or more examples above.

Pulse controller 1150 may be implemented within a memory controller, which may be implemented to pre-charge selectable bit lines (BLs) 1110 with corresponding pre-charge controls 1108 at the outset of read operations, such as described in one or more examples above.

The memory controller may be further implemented to couple selectable source lines (SLs) 1118 to a node 1120 under control of corresponding evaluation controls 1122 during read operations, such as described in one or more examples above. Node 1120 may correspond to ground.

Memory system 1100 may further include sensors 1128, each to determine logic values stored in MTJs of corresponding BLs 1110 bit lines, such as described in one or more examples above.

Figure 12:
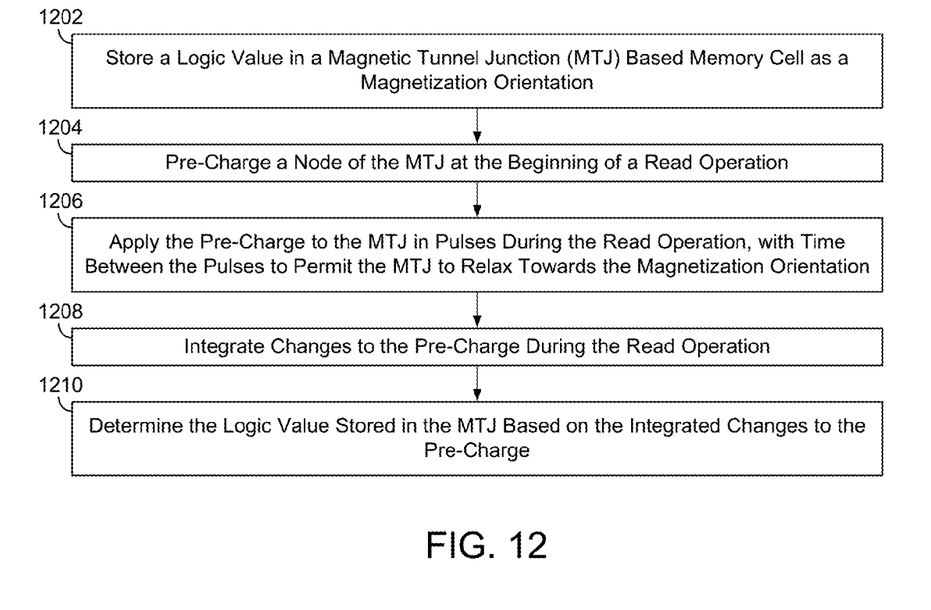
FIG. 12 is a flowchart of method of reading a logic value stored in a (MTJ) memory cell based on a pulsed read control.

FIG. 12 is a flowchart of method 1200 of reading a logic value stored in a magnetic tunnel junction (MTJ) based memory cell based on a pulsed read control.

At 1202, a logic value is stored in a MTJ-based memory cell as a magnetization orientation.

At 1204, a node of the MTJ is pre-charged at the beginning of a read operation.

At 1206, the pre-charge is applied the MTJ in pulses during the read operation, with time between the pulses to permit the MTJ to relax towards the magnetization orientation.

At 1208, changes to the pre-charge during the read operation are integrated.

At 1210, the logic value stored in the MTJ is determined based on the integrated changes to the pre-charge.

Methods and systems disclosed herein may be implemented in within one or more integrated circuit (IC) dies, alone and/or in combination with other integrated circuitry, such as a processor, and may be packaged as a stand-alone IC memory chip and/or packaged in an IC chip with other integrated circuitry.

Methods and systems disclosed herein may be implemented as part of a general purpose IC package, a domain-specific or application-specific integrated circuit (ASIC) package, and/or a combination of multiple integrated circuit packages.

Methods and systems disclosed herein may be implemented within a processor and/or communication system, such as described below with reference to FIG. 13. Methods and systems disclosed herein are not, however, limited to examples of FIG. 13.

Figure 13:
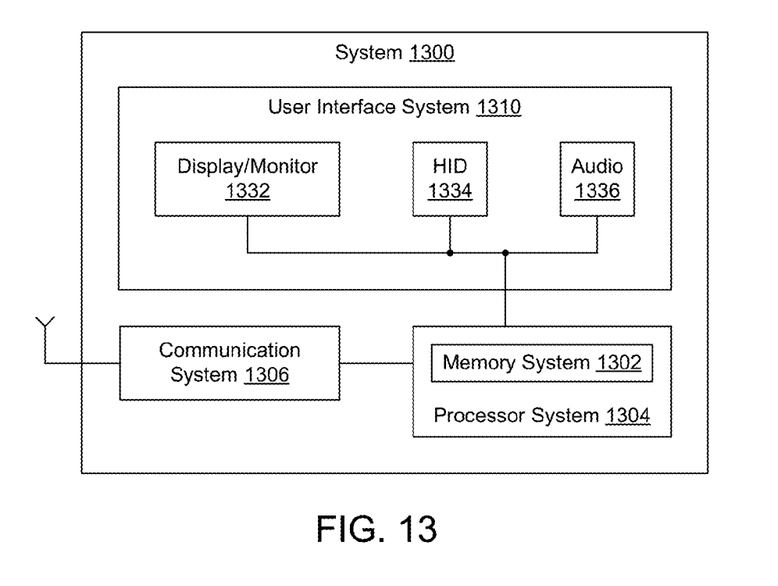
FIG. 13 is a block diagram of a system including a memory system as disclosed herein, and one or more of a processor, a communication system 1306, and a user interface system.

FIG. 13 is a block diagram of a system 1300, including a memory system as disclosed herein, and one or more of a processor 1304, a communication system 1306, and a user interface system 1310.

Communication system 1306 may be implemented to communicate between a network and one or more of processor system 1304 and user interface system 1310. Communication system 1306 may include a wired and/or wireless communication system.

User interface system 1310 may include a monitor or display 1332 to display information from processor 1304.

User interface system 1310 may include a human interface device (HID) 1334 to provide user input to processor 1304. HID 1334 may include, for example and without limitation, one or more of a key board, a cursor device, a touch-sensitive device, and or a motion and/or image sensor. HID 1334 may include a physical device and/or a virtual device, such as a monitor-displayed or virtual keyboard.

User interface system 1310 may include an audio system 1336 to receive and/or output audible sound.

System 1300 or portions thereof may be implemented within one or more IC dies and/or IC packages, and may be implemented as a system-on-a-chip (SoC).

System 1300 may correspond to, for example, a computer system, a personal communication device, and/or a television set-top box.

System 1300 may include a housing, and one or more of processor system 1304, communication system 1306, and user interface system 1310, or portions thereof, may be positioned within the housing. The housing may include, without limitation, a rack-mountable housing, a desk-top housing, a lap-top housing, a notebook housing, a net-book housing, a set-top box housing, a portable housing, and/or other conventional electronic housing and/or future-developed housing.

System 1300 may include a memory system 1302, which may include one or more magnetic tunnel junction (MTJ) based memory cells and a pulse controller, such as described in one or more examples herein. In the example of FIG. 13, memory system 1302 is illustrated as part of processor system 1304. Alternatively, or additionally, communication system 1306, display 1332, HID 1334, and/or audio system 1336 may include a memory cell system having MTJ-based memory cells and a pulse controller as described herein.

A memory system as disclosed herein may include a magnetic tunnel junction (MTJ) to store a logic value as a magnetization orientation.

A memory system as disclosed herein may further include pulsing means for applying a sequence of electrical pulses to the MTJ during a read operation, and means for providing time between the electrical pulses to permit the MTJ to relax towards the magnetization orientation between the electrical pulses.

A memory system as disclosed herein may further include sensing means for determining the stored logic value based on charge flow through the MTJ during the read operation.

A memory system as disclosed herein may include integration means for integrating an indication of the charge flow through the MTJ, and the sensing means may include means for determining the stored logic value based on the integrated indications of the charge flow.

The integrations means may include capacitive means for pre-charging and for integrating voltage discharges from the capacitive means. The sensing means may include voltage sensing means to determine the stored logic value based on the integrated voltage changes. The capacitive means may include an inherent capacitance of an integrated circuit trace.

A memory system as disclosed herein may include means for accessing the MTJ. A first node of the MTJ is coupled to a bit line, and the access means may include means for controllably coupling a second node of the MTJ to a source line. The controller means may include means for pre-charging the bit line, coupling the source line to ground, and controlling the access device with the sequence of electrical pulses during a read operation. The sensing means may include voltage sensing means for sensing a voltage of the bit line.

The controller means may include means for generating the sequence of electrical pulses as a sequence of symmetrical electrical pulses having substantially similar amplitudes and durations.

The controller means may include means for generating the sequence of electrical pulses to include one or more pulses for which one or more of an amplitude and a duration differ from that of another one of the electrical pulses.

The controller means may include means for generating the sequence of electrical pulses to provide successively decreasing current through the MTJ.

The controller means may include means for generating the sequence of electrical pulses with successively decreasing amplitudes.

The controller means may include means for generating the sequence of electrical pulses with successively decreasing pulse durations.

A pulsed read control as disclosed herein may reduce or eliminate build-up of momentum within a MTJ, which may reduce a disturb probability, or likelihood of inadvertent re-alignment of a magnetization orientation. A pulsed read control may be implemented to increase a critical current density margin relative to a continuous read control and/or to permit a higher read current.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. An apparatus, comprising:
   a memory cell that includes a magnetic tunnel junction (MTJ) device configured to store a logic value as a magnetic orientation;
   control circuitry configured to apply a read control to the memory cell during a read operation, wherein the read control includes a series of pulses, each configured to cause charge to flow through the MTJ device during the respective pulse without switching the magnetic orientation of the MTJ device; and
   sensor circuitry to determine the logic value stored in the MTJ device based on a sum of the charge that flows through the MTJ device due to respective pulses of the read control.

2. The apparatus of claim 1, wherein the control circuitry is further configured to:
   provide time between adjacent ones of the pulses to dissipate oscillations imparted to the MTJ device by the charge that flows through the MTJ device during preceding ones of the pulses.

3. The apparatus of claim 1, wherein the control circuitry includes:
   a charge storage structure coupled to a first node of the memory cell;
   pre-charge circuitry configured to pre-charge the charge storage structure to a pre-charge voltage prior to the series of pulses; and
   a controller configured to apply the series of pulses to the memory cell to alternately couple and decouple a second node of the MTJ device to and from a discharge node to cause charge of the charge storage structure to flow through the MTJ device during the respective pulses;

wherein the sensor circuitry includes a voltage sensor configured to determine the logic value stored in the MTJ device based on a remaining voltage of the charge storage structure subsequent to the series of pulses.

4. The apparatus of claim 1, wherein the control circuitry is further configured to:
vary at least a subset of the pulses of the read control relative to one another with respect to amplitude, duration, rise time, and/or fall time to maintain a margin between a current density imparted to the MTJ device by charge flow through the MTJ device during the pulses, and a critical current density at which the magnetic orientation of the MTJ device switches.

5. The apparatus of claim 1, wherein the control circuitry is further configured to:
generate the series of pulses to cause less charge to flow through the MTJ device during subsequent ones of the pulses relative to a first one of the pulses to prevent switching the magnetic orientation of the MTJ device during the subsequent pulses.

6. The apparatus of claim 5, wherein the control circuitry is further configured to:
generate the subsequent pulses with amplitudes that are lower than an amplitude of the first pulse to prevent switching the magnetic orientation of the MTJ device during the subsequent pulses.

7. The apparatus of claim 5, wherein the read circuitry is further configured to:
generate the subsequent pulses with durations that are shorter than a duration of the first pulse to prevent switching the magnetic orientation of the MTJ device during the subsequent pulses.

8. A memory system, comprising:
an array of memory cells, wherein each memory cell includes a magnetic tunnel junction (MTJ) device configured to store a logic value as a magnetization orientation;
control circuitry configured to apply a read control to a selectable wordline of the array during a read operation, wherein the read control includes a series of pulses, each configured to cause charge to flow through MTJ devices of a selected wordline during the respective pulses without switching the magnetic orientations of the MTJ devices of the selected wordline; and
multiple bit line sensors, each coupled to a respective bit line of the array and configured to determine a logic value stored in a MTJ device of a respective bit of the selected wordline, based on a sum of the charge that flows through the MTJ device due to respective pulses of the read control.

9. The system of claim 8, wherein the control circuitry is further configured to:
provide time between adjacent ones of the pulses to dissipate oscillations imparted to the MTJ devices of the selected wordline by the charge that flows through the MTJ devices during preceding ones of the pulses.

10. The system of claim 8, wherein the control circuitry includes:
a charge storage structure for each bit line of the array, wherein each bit line is coupled to a first node of each memory cell of a respective column of the array;
multiple pre-charge circuits, each configured to pre-charge a respective one of the charge storage structures;
multiple evaluation circuits, each configured to couple a respective source line of the array to a discharge node, wherein each source line is coupled to a second node of each memory cell of a respective column of the array; and
a controller configured to enable selectable ones of the pre-charge circuits prior to an evaluation period of the read operation, enable corresponding ones of the evaluation circuits for a duration of the evaluation period, and apply the series of pulses to the selected wordline of the array during the evaluation period to cause charge to flow through MTJ devices of the selected wordline during the respective pulses without switching the magnetic orientation of the MTJ device;
wherein each of the bit line sensors includes a voltage sensor configured to determine the logic value stored in the MTJ device of the respective bit of the selected wordline based on remaining voltages of the respective charge storage structure subsequent to the evaluation period.

11. The system of claim 10, wherein each of the storage structures is an inherent capacitance of an integrated circuit trace of the respective bit line.

12. The apparatus of claim 8, wherein the control circuitry is further configured to:
vary at least a subset of the pulses of the read control of the read control relative to one another with respect to amplitude, duration, rise time, and/or fall time to maintain a margin between a current density imparted to a MTJ device of the selected wordline by charge flow through the MTJ device during the pulses, and a critical current density at which the magnetic orientation of the MTJ device switches.

13. The apparatus of claim 8, wherein the control circuitry is further configured to:
generate the series of pulses to cause less charge to flow through a MTJ device of the selected wordline during subsequent ones of the pulses relative to a first one of the pulses to prevent switching the magnetic orientation of the MTJ device during the subsequent pulses.

14. The apparatus of claim 13, wherein the control circuitry is further configured to:
generate the subsequent pulses with amplitudes that are lower than an amplitude of the first pulse to prevent switching the magnetic orientation of the MTJ device during the subsequent pulses.

15. The apparatus of claim 13, wherein the read circuitry is further configured to:
generate the subsequent pulses with durations that are shorter than a duration of the first pulse to prevent switching the magnetic orientation of the MTJ device during the subsequent pulses.

16. The apparatus of claim 13, wherein the charge storage structure is an inherent capacitance of an integrated circuit trace between the voltage sensor and the first node of the memory cell.

17. A system, comprising:
a processor;
a user interface system;
a communication system to communicate between a communication network and one or more of the processor and the user interface system;
a memory system to store data under control of one or more of the processor, the communication system, and the user interface system, wherein the memory system includes,
a memory cell that includes a magnetic tunnel junction (MTJ) device configured to store a logic value as a magnetic orientation, a controller control circuitry configured to apply a read control to the memory cell during a read operation, wherein the read control includes a series of pulses, each configured to cause charge to flow through the MTJ device during the respective pulse without switching the magnetic orientation of the MTJ device, and sensor circuitry configured to determine the logic value stored in the MTJ device based on a sum of the charge that flows through the MTJ device due to respective pulses of the read control.

18. The system of claim 17, wherein the control circuitry is further configured to:

provide time between adjacent ones of the pulses to dissipate oscillations imparted to the MTJ device by the charge that flows through the MTJ device during preceding ones of the pulses.

19. The system of claim 18, wherein the control circuitry includes:

a charge storage structure coupled to a first node of the memory cell;

pre-charge circuitry configured to pre-charge the charge storage structure to a pre-charge voltage prior to the series of pulses; and a controller configured to apply the series of pulses to the memory cell to alternately couple and decouple a second node of the MTJ device to and from a discharge node to cause charge of the charge storage structure to flow through the MTJ device during the respective pulses;

wherein the sensor circuitry includes a voltage sensor configured to determine the logic value stored in the MTJ device based a remaining voltage of the charge storage structure subsequent to the series of pulses.

20. The system of claim 19, wherein the charge storage structure is an inherent capacitance of an integrated circuit trace between the voltage sensor and the first node of the memory cell.

* * * * *